United States Patent [19]
Brady

[11] Patent Number: 6,118,717
[45] Date of Patent: Sep. 12, 2000

[54] METHOD AND APPARATUS FOR LOADING DIRECTLY ONTO BIT LINES IN A DYNAMIC RANDOM ACCESS MEMORY

[75] Inventor: James Brady, Plano, Tex.

[73] Assignee: STMicroelectronics, Inc., Carrollton, Tex.

[21] Appl. No.: 09/354,401

[22] Filed: Jul. 15, 1999

[51] Int. Cl.$^7$ .................................................... G11C 7/00
[52] U.S. Cl. ............................................................ 365/207
[58] Field of Search .............................. 365/207, 189.01, 365/230.01, 230.03, 189.04

[56] References Cited

U.S. PATENT DOCUMENTS 5,586,078  12/1996  Takase et al. ....................... 365/230.03

*Primary Examiner*—Terrell W. Fears
*Attorney, Agent, or Firm*—Theodore E. Galanthay; Lisa K. Jorgenson; Andre Szuwalski

[57] ABSTRACT

A device for directly loading data onto bit lines of DRAMs. The device eliminates the need for performing a read cycle prior to a write cycle by bypassing the sense amplifiers of the DRAM. An I/O data line is connected to a bit line by a first transmission gate. A second transmission gate is electrically connected between the first transmission gate and the sense amplifier. A voltage level representing a data bit is loaded directly onto a bit line by turning off the second transmission gate to isolate the sense amplifier from the bit line and turning on the first transmission gate to connect the data line to the bit line. The voltage level on the bit line is then stored in a memory cell connected to the bit line.

20 Claims, 10 Drawing Sheets

METHOD AND APPARATUS FOR LOADING DIRECTLY ONTO BIT LINES IN A DYNAMIC RANDOM ACCESS MEMORY

BACKGROUND OF THE INVENTION

1. Technical Field of the Invention

The present invention relates to a method and apparatus for writing directly into the memory cells of dynamic random access memory (DRAM) devices.

2. Background of the Invention

The core of a DRAM is typically partitioned into arrays or blocks of memory cells, with each array including a plurality of rows of memory cells, wherein the cells in each row are connected to a respective one of a plurality of word lines. Memory cells in each column of cells in an array are connected to a respective one of a plurality of bit lines.

A conventional DRAM memory block 100, as shown in FIG. 1, is based upon a single transistor architecture wherein the memory cell 105 comprises a storage capacitor 125 having a first terminal connected to a common reference node and a second terminal connected to a memory cell transmission gate, most often a transistor 120. The common reference node is typically connected to a voltage supply, generated on-chip, that is typically Vdd/2. Alternatively, the common reference node may be set to another voltage level, such as Vss.

The memory cell transistor 120 serves to transport charge to and from the storage capacitor 125 of the memory cell 105. The gate electrode of the memory cell transistor 120 is tied to a word line 115 decode signal, and the drain electrode thereof is connected to a bit line 112. Data is stored in the memory cell 105 as a charge on the storage capacitor 125. To select a particular memory cell 105, a word line 115 is electrically enabled by address data that is sent to the DRAM and decoded by row and column decoders (not shown).

A row of block (BLK) pass gates 130 is electrically coupled between the memory block 100 and a row of sense amplifiers 135. The BLK pass gates 130 are designed to electrically isolate the memory block 100 from the row of sense amplifiers 135 to reduce power and capacitive load when utilizing the sense amplifiers in the DRAM and to also serve as block switches when the sense amplifier is multiplexed between two memory blocks.

Sense amplifiers 135 are typically connected to the bit line pairs 110 of dynamic memory. The sense amplifier 135 is generally used in read and refresh operations to drive each bit line to a reference voltage level. When the dynamic memory is in the read and/or refresh mode, the sense amplifier 135 is used to sense the small difference in potential between the bit lines 112 in a bit line pair 110 following a connection of a memory cell to a bit line pair 110 and to drive each bit line 112, based upon the sensed voltage differential, to the appropriate full reference voltage level, such as Vdd or Vss. Once the sense amplifier 135 drives the bit lines 112 in the bit line pair 110 to opposite full reference voltage levels, the memory cell 105 from which data was read is refreshed with the appropriate full reference voltage signal. For example, if the memory cell 105 being accessed stores data (i.e., a data bit) representing a logic high value, then the sense amplifier 135 will drive bit line 112 substantially to the full Vdd level so that the full vdd level is stored in memory cell 105 upon the word line corresponding thereto being de-energized.

In a typical DRAM configuration, data bits to be written into the memory cells from external circuitry from the DRAM are transferred thereto via an external I/O bus (not shown). I/O data lines 145 are electrically connected between write drivers/read detectors 150 and I/O pass gates 155. The write drivers 150 are generally a byte or word long.

In prior DRAM designs, there are fewer write drivers/read detectors 150 than sense amplifiers 135. In order to write a full row of data a byte or word at a time into the memory block 100, a decoder (not shown) is incorporated into the DRAM. For example, if the DRAM were to have the number of I/O lines 145 being a byte wide (i.e., 8 inputs/8 outputs), 512 memory cells 105 in a row, and 512 sense amplifiers 135, then the ratio of sense amplifiers 135 to write drivers/read detectors 150 would be 512:8 or 64:1, thus requiring a 64:1 decoder. Each of a plurality of I/O enable lines 160 drives a byte or word wide set of I/O pass gates 155. Each decoder output drives a distinct I/O enable line 160 so that only one set of I/O pass gates 155 is activated (and corresponding bit line pairs 110 are driven) at a time.

An I/O ENABLE line 160, used to selectively turn "ON" and "OFF" the I/O pass gates 155, connects to the gate terminal of the transistor of each I/O pass gate 155. To write to and read from a selected memory cell 105, the external I/O bus connects to write drivers/read detectors 150. The write drivers 150 are connected to a sense amplifier 135 of the DRAM by I/O data lines 145.

A sense amplifier 135 can be viewed as cross-coupled inverters, which operates as a latch. Each sense amplifier 135 is connected to sense amplifier circuit 135 comprising switches that short the nodes of the sense amplifier 135 together and allow for precharging of the nodes to a reference voltage, such as Vdd/2, prior to a memory read or refresh operation. The sense amplifier circuit 135 also comprises switches SP and SN that turn-on and/or provide power to the sense amplifier 135 by connecting the common node of N-channel transistors to Vss and the common node of P-channel transistors to Vdd. Control lines SP 162 and SN 164 are connected to the gate nodes of switches SP and SN, respectively, and control the supply of power to the row of sense amplifiers 135. Configuration and operation of the sense amplifier 135 is well known in the art.

There exists equilibrate circuitry 165 in a conventional DRAM device that comprises a pair of transistors 185, a third transistor 190, an EQ line 170, a Vdd/2 line 175, and a node 180 that is electrically connected to the Vdd/2 line 175 and between the pair of transistors 185. The EQ line 170 is a control line that is connected to the gate terminals of the pair of transistors 185 and the third transistor 190. Each transistor of the pair of transistors 185 includes a first source/drain terminal connected to a distinct bit line 112 of the bit line pair 110 and a second source/drain terminal connected at the node 180 to the Vdd/2 line 175. The third transistor 190 is connected between the bit line pair 110.

Control circuitry 195 of a typical DRAM device is used to drive the control lines coupled to the various transmission gates to logic high and low voltage levels in order for the DRAM device to perform memory read, refresh, and write operations. For simplicity, the control and power circuitry 195 is shown as a block.

FIG. 2 is a timing diagram illustrating the execution of a traditional read-write operation for the traditional DRAM as presented in FIG. 1. A read cycle is performed immediately prior to a write cycle for the purpose of preventing the data within memory cells 105 in the selected row of memory cells that is not being written to by the write operation from being corrupted. To begin the read cycle, the power to the sense amplifiers 135 is turned off by control line signals SP 162 and SN 164 being set to logic high and low voltage levels, respectively. An equilibrate (EQ) signal 170 is driven to a logic high voltage level prior to or at the time T20. Responsive thereto, each bit line pair 110 and nodes within the row of sense amplifiers 135 are balanced and precharged to the same voltage level, typically Vdd/2. Once each bit line pair 110 and sense amplifiers 135 are precharged, the EQ signal 170 is transitioned to a logic low voltage at time T21.

Next, at time T22, a word line (WL) signal 115 is transitioned to a logic high voltage level to couple a desired row of memory cells 105 to the bit lines 112. A block (BLK) signal 140 is at a logic high voltage level during the read-write cycle so that the BLK pass gates 130 are "ON" and the sense amplifiers 135 are electrically coupled to the bit lines 112. At this time, a relatively slight charge and/or voltage differential exists between bit lines 112 of each bit line pair 110 due to the charge stored in the selected memory cells 105 being shared with one of the bit lines 112.

Just before time T23, the SP 162 signal and SN 164 signal are asserted to apply power to the row of sense amplifiers 135. Each sense amplifier 135, sensing the charge differential appearing across the bit line pair 110 associated therewith, drives the bit line pair 110 to opposite reference voltage levels (Vdd and Vss levels), based upon the charge bias provided by the corresponding memory cell storage capacitor 125. This is shown in FIG. 2 as the bit line signals 112 for a single bit line pair 110 are transitioned to logic high and low voltage levels at time T23.

At time T24, the I/O enable signal 160 transitions to a logic high voltage level so that the write drivers 150 can write data to the selected bit lines 112 to overpower the selected sense amplifiers 135. This new data is transferred through BLK pass gates 130 by the action of the sense amplifiers 135 being overwritten by the write drivers 150 through the I/O pass gates 155. This data value charges or discharges the bit lines 112 of the selected bit line pairs 110 to Vdd or to Vss, respectively. The voltage applied to the bit lines 112 allows charging or discharging of the storage capacitor 125 connected thereto. At time T25, the word line signal 115 is transitioned to a logic low voltage level so that each storage capacitor 125 in the row is again isolated from the bit lines 112. The I/O enable signal 160 may also be transitioned to a logic low voltage level at time T25 to turn OFF the I/O pass gates 155. To complete the read-write cycle of the traditional DRAM circuitry, the BLK signal 140 is transitioned to a logic low voltage level to isolate the row of sense amplifiers 135 from the memory block 100. At the end of the memory access cycle, the signals may be transitioned to the equilibrate states to prepare for the next memory access cycle as these cycles are continuous.

Writing in the above manner requires that the circuitry associated with driving the I/O data lines 145, such as the I/O pass gates 155 and the write drive circuitry 150, comprise low impedance devices because the sense amplifiers 135, being connected to the bit lines driven by the I/O circuitry, themselves drive the bit lines to voltage levels corresponding to a prior read operation. Low impedance I/O circuitry is therefore necessary to sufficiently overpower the sense amplifiers.

With regard to corrupting the data in the memory cells, by first reading and refreshing the entire row of memory cells 105 using the row of sense amplifiers 135, the memory cells 105 along the word line 115 that are not being written into do not become corrupt due to previously read data remaining in the sense amplifier 135 that was driving the bit line pair 110.

It would be a significant benefit to be able to bypass the sense amplifier and write directly into the bit line pairs while preserving data previously loaded on to the bit line pair from a row of memory cells in the sense amplifiers for later use.

SUMMARY OF THE INVENTION

The present invention is a device for loading data directly into bit lines of a dynamic random access memory (DRAM). The DRAM comprises a memory array of memory cells arranged in rows and columns. A bit line is electrically connected to a column of memory cells within the memory array. A word line is electrically connected to a row of memory cells.

The device comprises an I/O data line and a first transmission gate electrically connected between the I/O data line and the bit line. A second transmission gate is electrically connected between the bit line and a sense amplifier.

A first embodiment further comprises a third transmission gate connected between the I/O data line and the sense amplifier. A second embodiment further comprises a third transmission gate connected between the connection of the first transmission gate to the bit line and the bit line connection to the memory cell.

In operation, the method for loading data directly into the bit lines and storing the data in a memory cell of the dynamic random access memory comprises the steps of (1) isolating the sense amplifier from the bit line, (2) driving the bit line with a voltage level representative of a logic high or logic low voltage level, and (3) storing a charge corresponding to the voltage level in a selected memory cell electrically connected to the bit line.

BRIEF DESCRIPTION OF THE DRAWINGS

A more complete understanding of the present invention may be had by reference to the following detailed description when taken in conjunction with the accompanying drawings wherein.

DETAILED DESCRIPTION OF THE PREFERRED EMBODIMENTS

Figure 3:
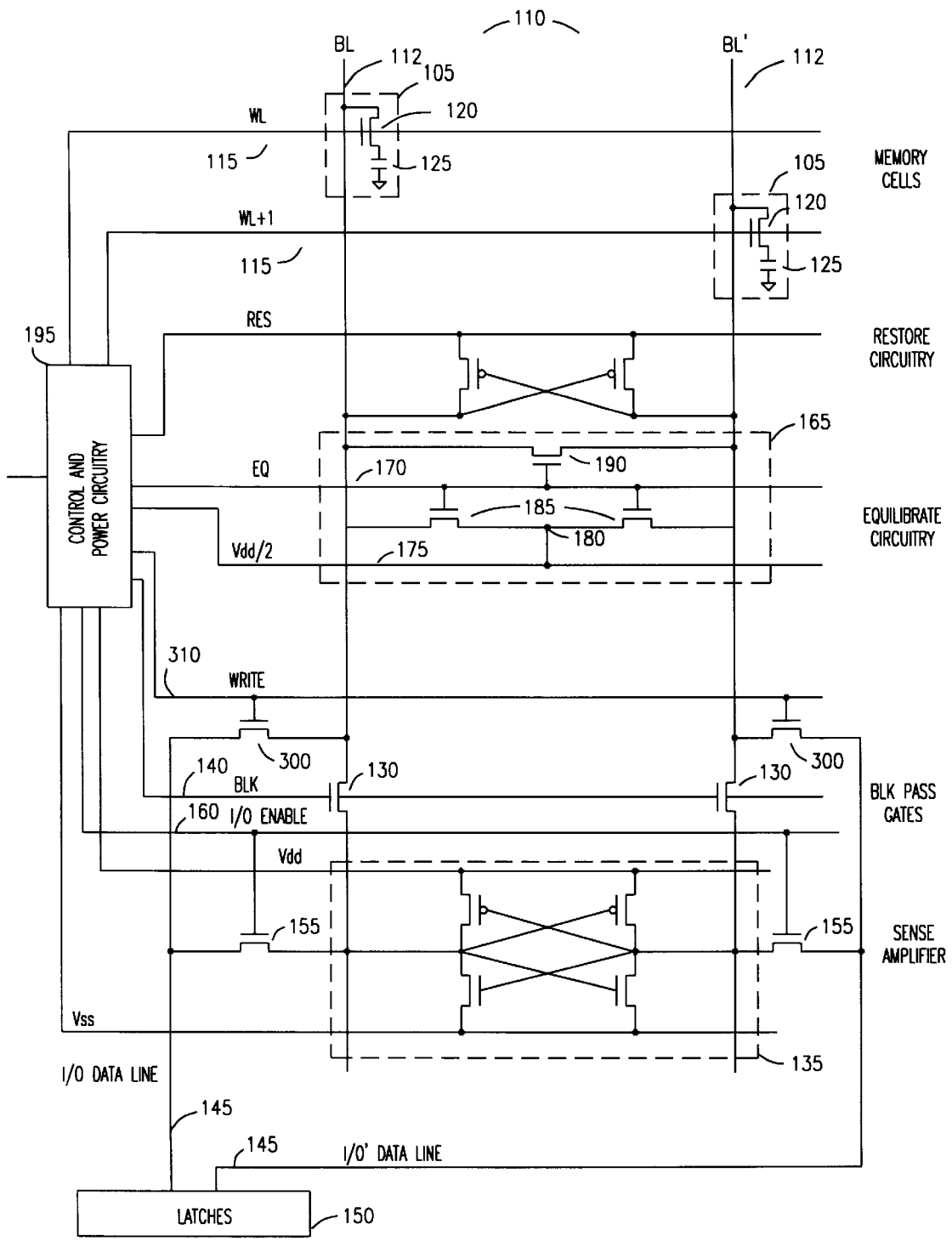
FIG. 3 is a circuit diagram illustrating a first embodiment of the present invention.

FIG. 3 is a circuit diagram for a first embodiment of the present invention. Rather than showing the entire DRAM circuitry, a representative portion of the circuitry is shown, including the memory cells 105 attached to the bit line pair 110, the word lines 115, the associated BLK pass gates 130 connected to the bit line pair 110, the sense amplifier 135 connected to the bit line pair 110, the sense amplifier equilibrate circuit 138, the BLK line 140 (i.e., control line for the BLK pass gates 130), and the I/O data lines 145. It is understood that the circuitry shown in FIG. 1 is substantially replicated for each bit line pair of the present DRAM device. The present invention, however, utilizes a row of latches 150 (simply shown as a block) rather than write drivers and read detectors comprising a byte or word width of data. Other circuitry shown includes the I/O pass gates 155 and the I/O enable line 160, which controls the "ON" and "OFF" state of the I/O pass gates 155. Further included in the first embodiment is bit line equilibrate circuitry 165.

Additional circuitry is incorporated into the present DRAM to provide the ability to write directly into the bit line pair 110 while bypassing sense amplifier 135. This additional circuitry includes write pass gates 300 each connected to a different bit line 112, and a write line 310 to turn the write pass gates 300 "ON" and "OFF". The BLK pass gates 130, the write pass gates 300, and the I/O pass gates 155 may be essentially equal in size.

Figure 4:
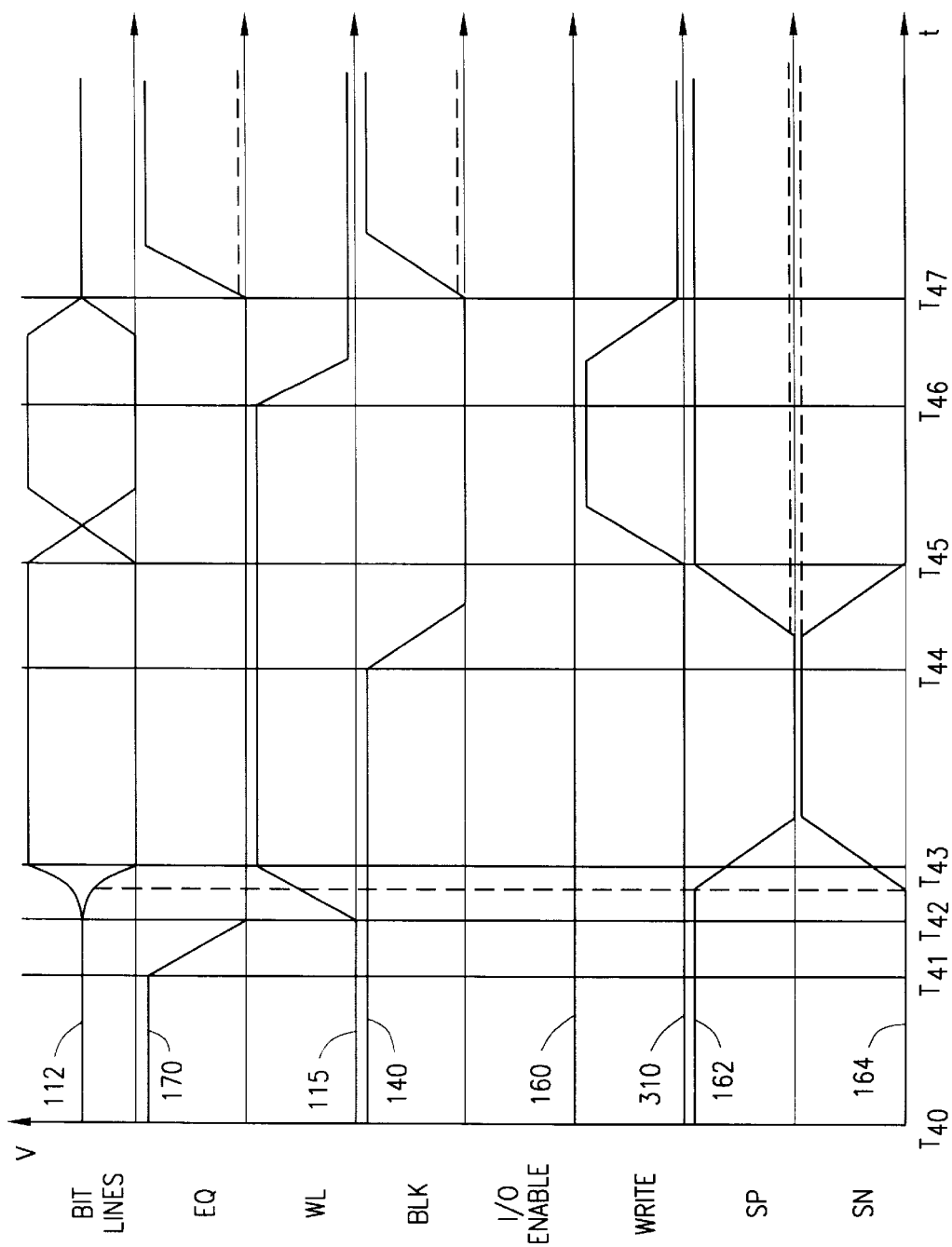
FIG. 4 is a timing diagram illustrating the execution of a read-write operation for the first embodiment of the present invention.

FIG. 4 is an exemplary timing diagram for performing a read-write operation to a memory cell 105 associated with a bit line 112 of bit line pair 110 and the selected word line 115. This read-write operation must be performed when writing only to a portion of memory cells 105 in the selected row. The read operation is utilized to refresh the memory cells 105 along the word line 115 that are not being written to. The data in the memory cells 105 along the selected word line 115 that are not written to during the write cycle is therefore not corrupted.

To begin the read cycle, power to the sense amplifier 135 is turned off by applying a logic high and low voltage level to control lines SP 162 and SN 164, respectively. An equilibrate (EQ) signal 170 next transitions to a logic high voltage level prior to time T40 thereby equalizing and precharging the bit line pair 110 and the nodes within sense amplifier 135. Once the bit line pair 110 and sense amplifier 135 are precharged and equalized, the EQ line 170 is transitioned to a logic low voltage level at time T41. Next, the word line (WL) signal 115 transitions to a logic high voltage level at time T42. It should be noted that during this read operation, the BLK line 140 is maintained at a logic high voltage level so that the sense amplifier 135 is electrically coupled to the bit line pair 110.

At the time that the WL signal 115 is transitioned to a logic high voltage level, the memory cell transistor 120 turns "ON" and the storage capacitor 125 is coupled directly to the bit line 112. The logic high or low voltage level stored as charge in the memory storage capacitor 125 causes the bit line 112 to be slightly biased toward either the Vdd or Vss voltage level, respectively, relative to the charge on the other bit line 112 of the bit line pair 110. The SP 162 signal and SN 164 signal are then transitioned between times T42 and T43. The sense amplifier 135, now powered up and sensing the differential appearing on the bit line pair 110, drives the bit lines 112 of bit line pair 110 to the appropriate reference voltage levels, Vdd or Vss. This is shown in FIG. 4 as the bit lines 112 of the bit line pair 110 transition based upon the bias initiated by the storage capacitor 125 to logic high or low voltage levels at time T42.

The storage capacitors 125 are either recharged or discharged to Vdd or Vss, respectively, at this time in the read cycle. As an aside, the slight transition in charge level between the bit line pair 110 at time T42 is due to the bit lines 112 having a much higher capacitance than the storage capacitors 125. Because this read operation is not part of the present invention, the complete detailed description incorporating the use of dummy cells (not shown, but known in the art) is not provided.

At time T44, the BLK signal 140 toggles from a logic high to a logic low voltage level. This turns the BLK pass gates 130 "OFF" (i.e., the BLK pass gates 130 switch to a high impedance state) so that the sense amplifier 135 is isolated from the bit line pair. The SP 162 signal and SN 164 signal may be transitioned (solid line) when the sense amplifier 135 is isolated from the bit line pair 110 or may be maintained (dashed line) to keep the sense amplifier 135 turned on to preserve the data read from the memory cells 105 latched in the sense amplifier 135 for later reading.

At time T45, the write signal 310 transitions from a logic low to logic high voltage level causing the write pass gates 300 to turn "ON". Once the write pass gates 300 are turned "ON", the I/O data lines 145 are electrically coupled to the bit line pair 110. This transition of the write signal 310 indicates the end of the read cycle and the start of the write cycle. The SP 162 signal and SN 164 signal may be transitioned to logic level voltage states (solid line) to turn OFF power to the sense amplifier 135. Alternatively, the SP 162 signal and SN 164 signal may be kept in logic level voltage states (dashed lines) to maintain power to the sense amplifier 135 so as to maintain the data in the sense amplifier 135 during the direct write operation. Either scenario, it is noted that the sense amplifier 135 is isolated from both the bit line pair 110 and drive circuitry 150.

To start the write cycle, when the write signal 310 is switched "ON" at time T45, the value stored in the latch 150 associated with the I/O data lines 145 is loaded onto the bit lines 112 of the bit line pair 110 as seen by the transition of the bit line signals 112 just after time T45. After both the bit lines 112 of the bit line pair 110, as well as the storage capacitor 125 of the memory cell 105, have been suitably charged, the word line (WL) signal 115 toggles to a low voltage state at time T46, thereby isolating the storage capacitor 125 from the bit line 112 by turning "OFF" the memory cell transistor 120.

Thereafter, but before time T47, the write signal 310 toggles to the low voltage level and the read-write cycle is complete. This write signal 310 transition marks the completion of the read-write procedure. The data latched into the sense amplifier 135 may then be read if the power were maintained to the sense amplifier 135. At the end of the memory access cycle, the signals may be transitioned to is the equilibrate states to prepare for the next memory access cycle as these cycles are continuous.

For comparison purposes, the traditional write operation only has the capability of maintaining the electrical connection between sense amplifier 135 and the bit line pair 110. Also, with the traditional write operation, the sense amplifier 135 must maintain electrical connection to the I/O data lines 145 by setting the I/O enable line 160 to a logic high voltage level, thereby turning the I/O pass gates 155 "ON". Note that the first embodiment of the present invention maintains a logic low voltage level on the I/O enable line 160 during the read-write sequence so that the sense amplifier 135 is bypassed during the write operation. By utilizing the write pass gates 300 and isolating the sense amplifier 135 (by turning "OFF" the BLK pass gates 130), the I/O data lines 145 are not required to overpower the sense amplifier 135.

Also, by isolating the sense amplifier 135 after performing the read operation, the previous value of the memory cell 105 prior to the write operation that is latched in the sense amplifier 135 can be read later from the sense amplifier by turning "OFF" the write pass gates 300 and turning "ON" the I/O pass gates 155.

Figure 5:
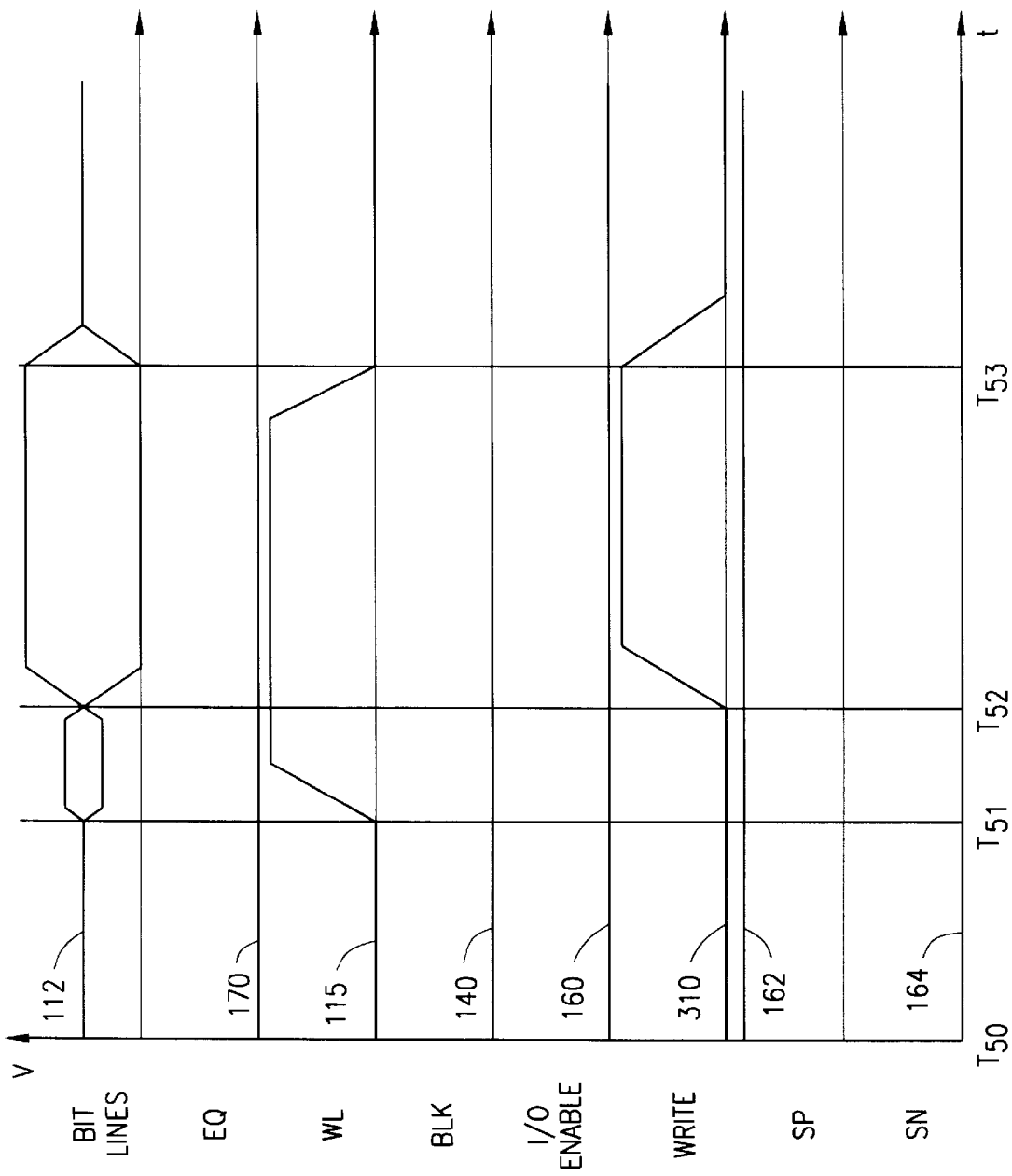
FIG. 5 is a timing diagram illustrating the execution of a direct write operation of the first embodiment of the present invention.

As shown in the timing diagram of FIG. 5, the present invention may perform a full-page direct write operation in a single memory access without first performing a read operation. A full-page write operation is a write operation that writes in parallel to each memory cell 105 along a row of memory cells 105 from write drivers 150. During this direct write operation, the BLK signal 140 remains at a logic low state or level so that the sense amplifier 135 remains isolated from the bit line pair 110 (i.e., the sense amplifier 135 is bypassed during the direct write). During the direct write operation, the EQ signal 170 also remains low because it is not necessary to equalize and precharge the bit lines 112.

At time T51, the word line signal 115 transitions from a logic low to logic high voltage level so that the storage capacitor 125 of the memory cell 105 along the selected word line 115 is electrically coupled to the bit line 112. The coupling of the storage capacitor 125 applies its charge to the bit lines 112 thereby causing the voltage of the bit lines 112 to slightly separate.

At time T52, the write signal 310 transitions from a low to high voltage level so that the write pass gates 300 are turned "ON" and the I/O data lines 145 are electrically connected to the bit line pair 110. Alternatively, the WL signal 115 and the write signal 310 can transition at the same time or the write signal 310 transition can happen first and the memory cell 105 response will be the same. The data in the I/O data lines 145 are written into the bit line pair 110 in conjunction with the transition of the write signal 310 turning on the write pass gates 300. The reversal of the voltage levels on the bit lines 112 is exemplary of the overpowering of the memory cell data by the direct write process. The data written into the bit line pair 110 either charges the storage capacitor 125 to Vdd or Vss, as seen on the bit line pair signals 110 being transitioned to Vdd or Vss.

Prior to time T53, the word line (WL) signal 115 transitions to a logic low voltage level and then at time T53, the write signal 310 transitions to a logic low voltage level. This WL signal 115 transition stores in the storage capacitor 125 the logic level that was on the bit line 112. This marks the completion of the direct write operation to the bit lines 112. At the end of the memory access cycle, the signals may be transitioned to the equilibrate states to prepare for the next memory access cycle as these cycles are continuous.

Figure 6:
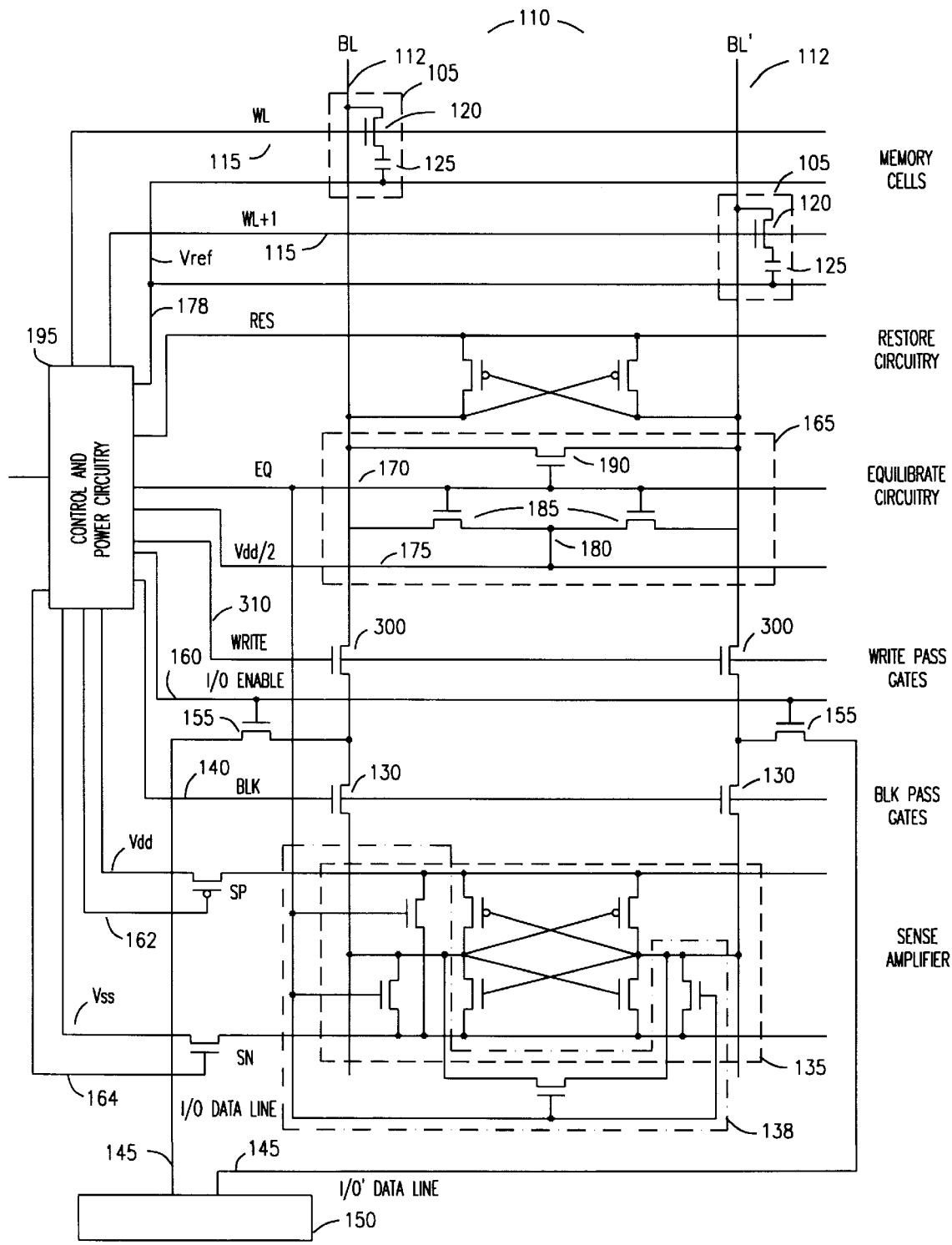
FIG. 6 is a circuit diagram illustrating a second embodiment of the present invention.

A second embodiment of the present invention is shown in FIG. 6. The second embodiment comprises the same additional circuitry elements as the first embodiment, including the write pass gates 300 and the write line 310. The configuration of the second embodiment, however, is somewhat different from the first embodiment. This configuration electrically couples the I/O data lines 145 to the bit line pair 110 on the opposite side of the BLK pass gates 130 with respect to the sense amplifier 135. The write pass gates 300 are located between the bit lines 112 and block pass gates 130. In addition, I/O pass gates 155 are connected between I/O data lines 145 and the nodes between write pass gates 300 and block pass gates 130. This configuration provides the same ability to perform the read-write operations and the direct write operations of the present invention.

Figure 7:
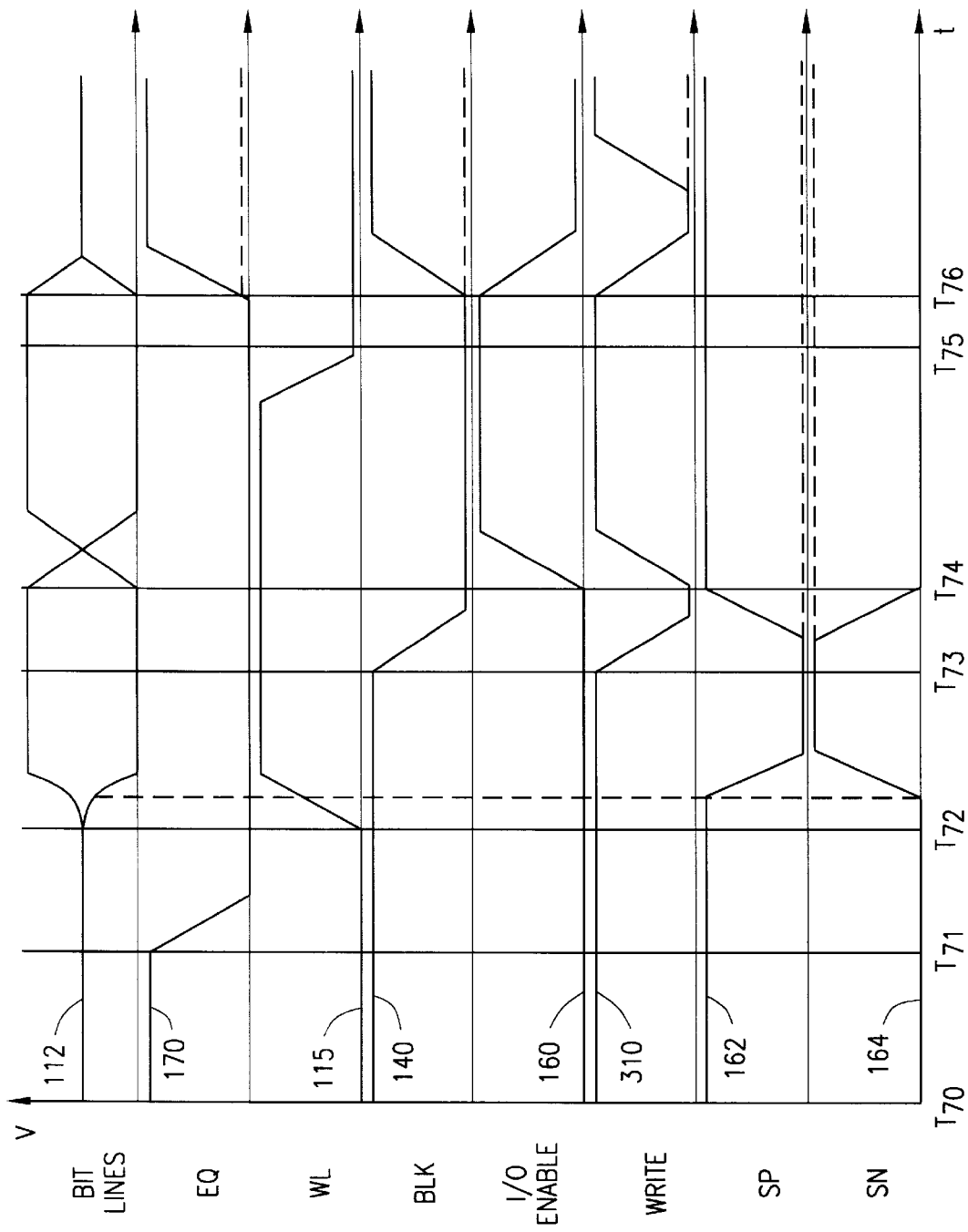
FIG. 7 is a timing diagram illustrating the execution of a read-write operation for the second embodiment of the present invention.
Figure 8:
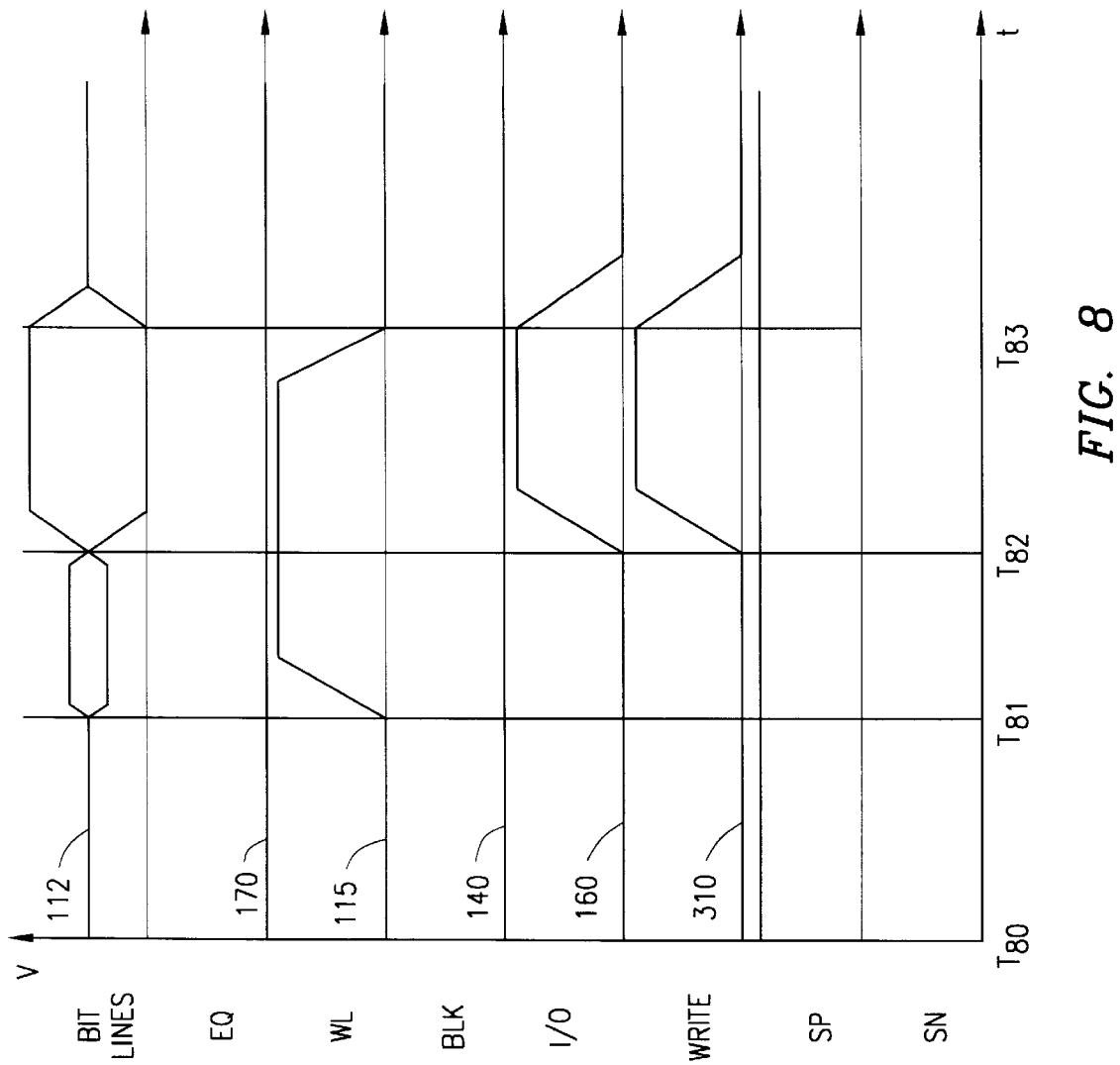
FIG. 8 is a timing diagram illustrating the execution of a direct write operation of the second embodiment of the present invention.

The operation of the second embodiment is herein explained by the timing diagrams shown in FIGS. 7 and 8.

FIG. 7 is a timing diagram for the read-write cycle of the second embodiment, and FIG. 8 is a timing diagram for the direct write cycle of the second embodiment.

The timing for the second embodiment comprises basically the same signals as the first embodiment. However, since the configurations of the I/O pass gates 155 and the write pass gates 300 are different from the first embodiment, the timing is different for the I/O enable signal 160 and the write signal 310.

To begin the read-write operation for the second embodiment, the power to the sense amplifier 135 is turned off by the control lines SP 162 and SN 164 being applied logic high and low voltage levels, respectively. The I/O enable signal 160 is maintained low during the entire read cycle. The bit line pair 110 and sense amplifier 135 are then equalized and precharged by the EQ signal 170 transitioning to a logic high voltage level at time T70. The BLK signal 140 and the write signal 310 are also at logic high voltage levels so that the sense amplifier 135 is electrically connected to the bit lines during the equalization and precharge operation.

At time T71, the EQ signal 170 transitions to a logic low voltage level to complete the equalization and precharge operation.

At time T72, the word line 115 is transitioned to a logic high voltage level so that the storage capacitor 125 of the memory cell 105 along the selected word line 115 is electrically connected to the sense amplifier 135. The charge stored in the storage capacitor 125, being shared with corresponding bit line 112, causes a charge differential appearing across the bit line pair 110. The SP 162 signal and SN 164 signal are transitioned between times T72 and T73 after the WL signal 115 transitions to apply power to the sense amplifier 135. The sense amplifier 135, sensing a charge differential on the bit line pair 110, completes driving the bit lines 112 to Vdd or Vss, depending upon the bias initiated by the storage capacitor 125. This is shown in FIG. 7 after T72 as the bit line pair signals 110 are transitioned to either Vdd or Vss.

At time T73, the BLK signal 140 transitions to a logic low voltage so that the sense amplifier 135 is isolated from the bit line pair 110. This isolation of the sense amplifier 135 from the bit line pair 110 signifies the end of the read and/or refresh cycle. After time T73, the SP 162 signal and SN 164 signal may be transitioned to logic level voltage states (solid line) to turn off power to the sense amplifier 135. Alternatively, the SP 162 signal and SN 164 signal may be kept in logic level voltage states (dashed lines) to maintain power to the sense amplifier 135 in order to maintain data in the sense amplifier 135 during the direct write operation. The EQ signal 170 is maintained in a logic low voltage level (dashed line) while the sense amplifier 135 is powered up. The write signal 310 may also be transitioned to a logic low voltage level at time T73. Either scenario, it is noted that the sense amplifier is isolated from both the bit line pair 110 and drive circuitry 150.

At time T74, both the I/O enable signal 160 and write signal 310 are transitioned to a logic high voltage level so that a direct write into the bit lines 112 while bypassing the sense amplifier 135 can occur. The I/O enable signal 160 and write signal 310 do not have to switch simultaneously, however, but both must be at a logic high voltage level so that the I/O data line 145 is electrically connected to the bit line 112. Once both are logic high voltage levels, each bit line signal 112 transitions to the voltage levels appearing on their corresponding I/O data line 145. As the word line (WL)

signal 115 is a logic high voltage level, the storage capacitor 125 is coupled to the bit line 112 and is charged or discharged to the same voltage level on the bit line 112.

At time T75, the word line signal 115 transitions to a logic low voltage level to isolate the storage capacitor 125 from the bit line 112. This word line signal 115 transitions after the storage capacitor 125 has been charged or discharged to either Vdd or Vss. At time T76, the I/O enable signal 160 and the write signal 310 are transitioned to logic low voltage levels, thereby signifying the end of the read-write operation. At the end of the memory access cycle, the signals may be transitioned to the equilibrate states to prepare for the next memory access cycle as these cycles are continuous.

Referring to FIG. 8, the second embodiment of the present invention may perform a full-page direct write operation in a single memory access without first performing a read operation. The BLK signal 140 remains logic low so that the sense amplifier 135 remains isolated from the bit line pair 110 and bypassed during the direct write operation. During the direct write operation, the EQ signal 170 also remains low because it is not necessary to equalize and precharge the bit lines and sense amplifier 135. The SP 162 signal and SN 164 signal may be transitioned to logic level voltage states (solid line) to turn OFF power to the sense amplifier 135.

At time T81, the word line signal 115 transitions from a logic low to logic high voltage level so that the storage capacitor 125 of the memory cell along the word line 115 is electrically coupled to the bit line 112. The coupling of the storage capacitor 125 applies its charge to the bit lines 112 thereby causing the voltage on the bit lines 112 to slightly separate.

At time T82, the I/O enable signal 160 and write signal 310 are transitioned from logic low to logic high voltage levels so that the I/O data lines 145 are coupled to the bit line pair 110 and memory cells 105. At this point, bit lines 112 and memory cell 105 are driven to voltage levels corresponding to data to be stored in memory cell 105. Alternatively, the word line signal 115 and the I/O enable signal 160 and write signal 310 can transition at different times. However, note that the bit line pair 110 and I/O data lines 145 are coupled in the second embodiment when the I/O enable signal 160 and the write signal 310 are both logic high voltage levels. The reversal of the voltage levels on the lines 112 is exemplary of the overpowering of the memory cell data by the direct write process.

Just before time T83, the word line signal 115 is transitioned to a logic low voltage so that the storage capacitor 125 is again isolated from the bit line 112, thereby storing the data in memory cell 105. Then, at time T83, the I/O enable signal 160 and write signal 310 can transition to logic low voltage levels. This electrically isolates the I/O data lines 145 from the bit line pair 110 and marks the end of the direct write cycle for the second embodiment of the present invention. At the end of the memory access cycle, the signals may be transitioned to the equilibrate states to prepare for the next memory access cycle as these cycles are continuous.

Figure 9:
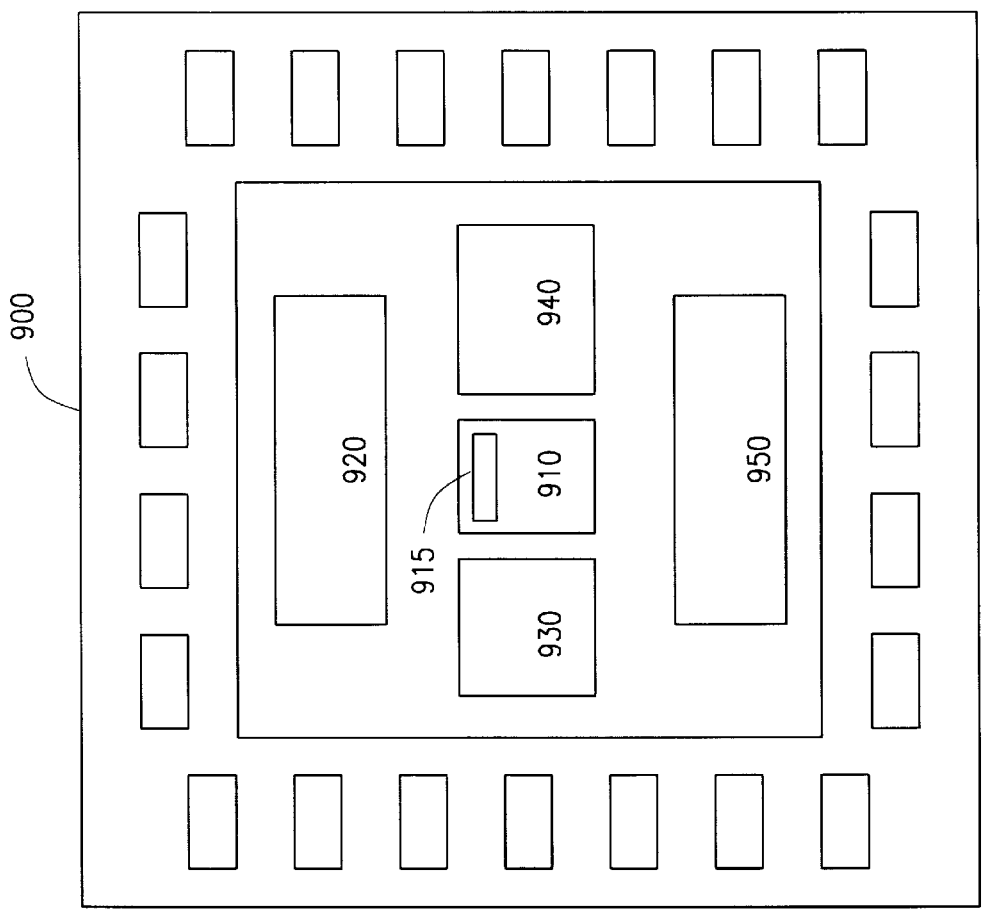
FIG. 9 is a top plan view of an integrated circuit chip having disposed thereon a dynamic memory device (embedded DRAM) according to a preferred embodiment of the present invention.

The present invention is particularly suited for dynamic memory devices that are embedded within an integrated circuit fabricated by a process that is not tailored for optimal DRAM performance, such as an ASIC process. FIG. 9 illustrates an ASIC chip 900 having disposed thereon an embedded DRAM device 910 (including the direct write circuit 915) and other circuitry 920–950 which, when combined, performs a specific application. The direct write circuit 915, when implemented within DRAM device 910, allows the ASIC chip 900 designer to quickly write directly to the bit lines in parallel. This invention has utility in testing DRAM by allowing for rapid loading of test pattern data into a row of memory cells. Finally, this invention is not limited to DRAM or embedded DRAM, but can be implemented in any compatible memory or embedded memory such as: SRAM, flash memory, EPROM, etc.

One of the reasons that the DRAM process (i.e., not embedded within an ASIC process) does not lend itself very well to allowing for a direct write into the memory cells by bypassing the sense amplifier is that the DRAM manufacturing process for producing stand-alone DRAM devices is generally limited to only a few layers of metal, typically two or three. This limitation of only a few metal layers is mainly due to production cost as opposed to technical capability. The ASIC process provides greater flexibility in designing circuitry, including DRAMs, because ASICs usually utilize more metal layers which, in some circumstances, result in denser layouts. Also, DRAMS made from an ASIC process can more efficiently employ additional circuitry to perform new functions not found in standard, off-the-shelf DRAMs due to silicon area considerations. Embedded DRAMs within an ASIC process can incorporate the additional functionality or have custom designed circuitry interfaced to the DRAM.

Again, the present invention allows the sense amplifier of a DRAM to be isolated during a direct write operation. However, if the entire row of memory cells is not to be overwritten, a read and refresh operation is necessary before a direct write operation to that row of memory cells so that data stored in memory cells not being written to is preserved. Other sequential direct write operations to memory cells in the row of memory cells do not require a read and refresh cycle.

The operational advantages of the present invention are many, including: (1) more bit lines may be accessed in parallel with a low average current because there are no cross-coupled latches in the sense amplifiers to overcome, (2) data from reading an entire row of memory cells can be stored in the sense amplifier array for later use, and (3) a direct write into the bit lines, which have already been read, will only take a small amount of time to change states fully due to the reduced capacitance loading by isolating the sense amplifiers from the bit lines.

Another advantage of the present invention is that writing directly into the bit lines is the best way to accomplish a write into an entire row of memory cells from peripheral circuitry to the DRAM in a single memory cycle. The peripheral circuitry (i.e., interfacing circuitry) to the DRAM is designed into the surrounding circuitry that the DRAM is embedded. The surrounding circuitry can be a variety of devices such as a microprocessor, an ASIC, or digital signal processor (DSP).

Although the preferred embodiment of the present invention has been illustrated in the accompanying drawings and described in the foregoing detailed description, it will be understood that the invention is not limited to the embodiments disclosed, but is capable of numerous rearrangements, modifications and substitutions without departing from the spirit of the invention as set forth and defined by the following claims.

What is claimed is:

1. A device for loading data directly into bit lines of a dynamic random access memory (DRAM), the device comprising:

a bit line;

a sense amplifier;

an I/O data line;

a first transmission gate electrically connected between the I/O data line and the bit line;

a second transmission gate electrically connected between the sense amplifier and the electrical connection of the first transmission gate to the bit line, wherein a data bit bypasses the sense amplifier and is written directly into the bit line from the I/O data line when the first transmission gate is turned on and the second transmission gate is turned off.

2. The device as in claim 1, further comprising:

a memory array of memory cells;

a word line being electrically connected to a row of memory cells within the memory array; and the bit line being electrically connected to a column of memory cells within the memory array.

3. The device as in claim 1, wherein the first and second transmission gates comprise first and second transistors of essentially the same size.

4. The device as in claim 1, further comprising a third transmission gate electrically connected between the I/O data line and the sense amplifier.

5. The device as in claim 1, further comprising a third transmission gate electrically connected between the electrical connection of the first transmission gate to the bit line and an electrical connection of a memory cell to the bit line.

6. A method for loading data directly into a dynamic random access memory (DRAM) having a bit line, an I/O data line, and a sense amplifier connected to the bit line, the method comprising the step of bypassing the sense amplifier while writing a logic voltage level from the I/O data line directly into the bit line.

7. The method as in claim 6, wherein the step of bypassing further comprises the steps of:

isolating the bit line from the sense amplifier; and connecting the I/O data line to the bit line while the sense amplifier is isolated from the bit line.

8. The method as in claim 6, further comprising the step of reading a logic voltage level from the bit line through the sense amplifier before the step of bypassing the sense amplifier.

9. The method as in claim 8, further comprising the step of reading the logic voltage level that was read into the sense amplifier prior to writing directly into the bit line from the sense amplifier.

10. A device for accessing a dynamic random access memory (DRAM) having a bit line, an I/O line, and a sense amplifier electrically connected to the bit line, the device comprising:

means for isolating the sense amplifier from the bit line;

means for selectively connecting the I/O data line directly to the bit line; and means for driving the I/O data line to a first voltage level representative of a high logic level and a second voltage level representative of a low logic level to write data onto the bit line.

11. The device as in claim 10, further comprising means for selectively electrically connecting the I/O data line to the sense amplifier.

12. The device as in claim 10, further comprising means for selectively electrically connecting the bit line to a memory cell.

13. The device as in claim 10, wherein:

the means for selectively connecting the I/O data line directly to the bit line comprises a first transistor; and the means for selectively isolating the sense amplifier from the bit line comprises a second transistor, wherein the first transistor and the second transistor are of essentially the same size.

14. A method for loading data directly into dynamic random access memory (DRAM) having a bit line, an I/O data line, and a sense amplifier connected to the bit line and the I/O data line, the method comprising the steps of:

isolating the sense amplifier from the bit line;

connecting the I/O data line directly to the bit line to bypass the sense amplifier; and driving the bit line with a voltage level representative of a logic high or a logic low voltage level for data to be loaded.

15. The method as in claim 14, further comprising the step of storing the voltage level driven on the bit line in a memory cell electrically connected to the bit line.

16. The method as in claim 15, wherein the step of storing further comprises the step of turning a transmission gate coupled between the bit line and a storage capacitor for the memory cell on.

17. The method as in claim 14, wherein the step of isolating the sense amplifier from the bit line further comprises the step of selectively turning a pass gate connected between the bit line and the sense amplifier off.

18. The method as in claim 14, wherein the step of connecting the I/O data line to the bit line further comprises the step of selectively turning a pass gate connected between the I/O data line and the bit line on.

19. A method for loading data directly into dynamic random access memory (DRAM) having a memory array of memory cells arranged in rows of word lines and columns of bit line pairs, each bit line pair being connected to a column of memory cells within the memory array, a row of sense amplifiers connected to the columns of bit line pairs, the method comprising the steps of:

reading the memory array along the word line into the sense amplifiers;

isolating the row of sense amplifiers from the columns of bit line pairs;

connecting at least one I/O data line to at least one of the bit line pairs; and driving the columns of bit line pairs with a logic high and a logic low level.

20. The method as in claim 19, wherein the steps of isolating and connecting comprise turning off and on a plurality of transistors of essentially the same size.

* * * * *

UNITED STATES PATENT AND TRADEMARK OFFICE
CERTIFICATE OF CORRECTION

PATENT NO.    : 6,118,717
DATED         : September 12, 2000
INVENTOR(S)   : James Brady Page 1 of 1

Figure 1A:
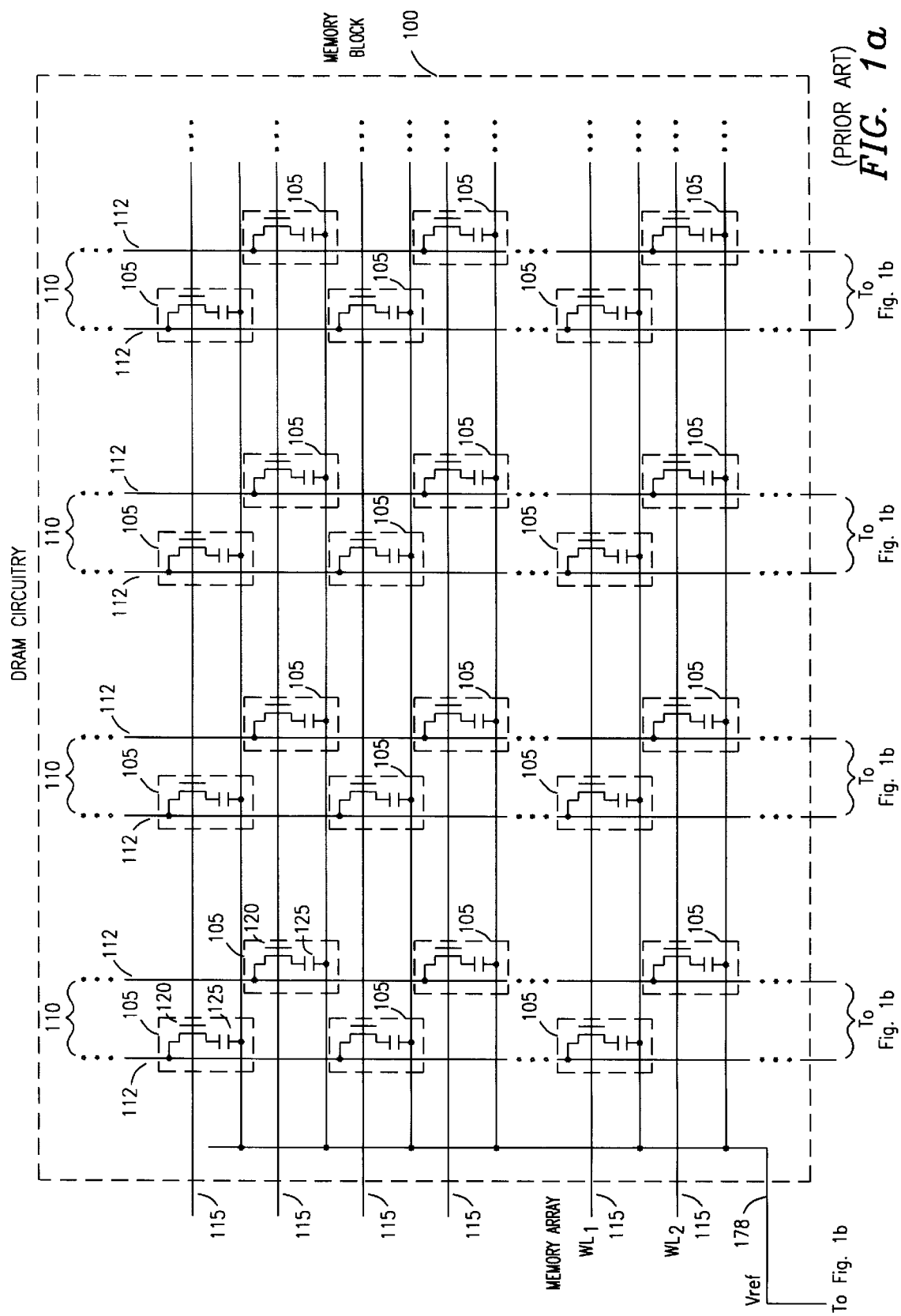
FIG. 1, previously described in part, is a circuit diagram of a portion of a traditional DRAM memory array.
Figure 1B:
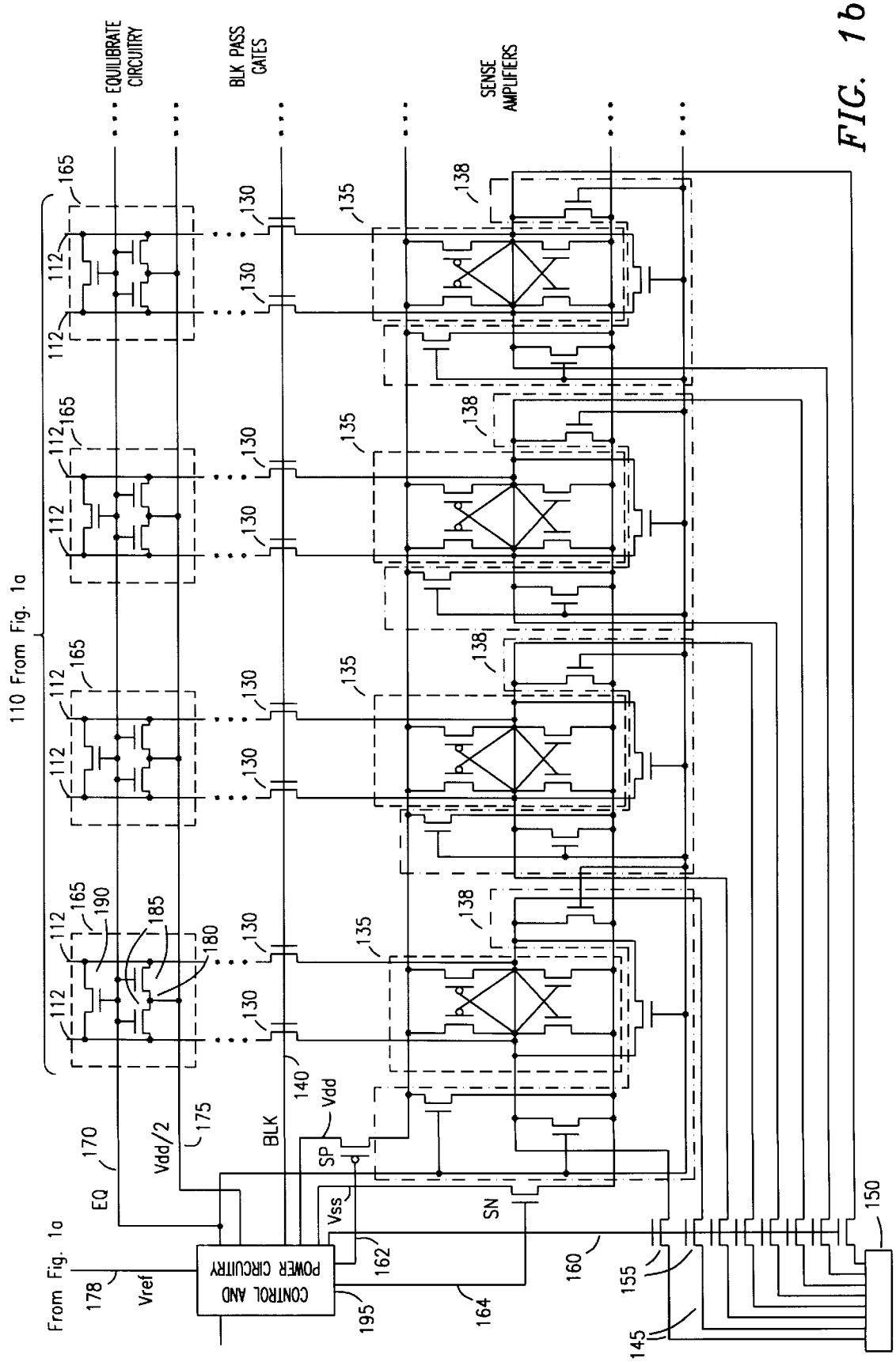
Figure 2:
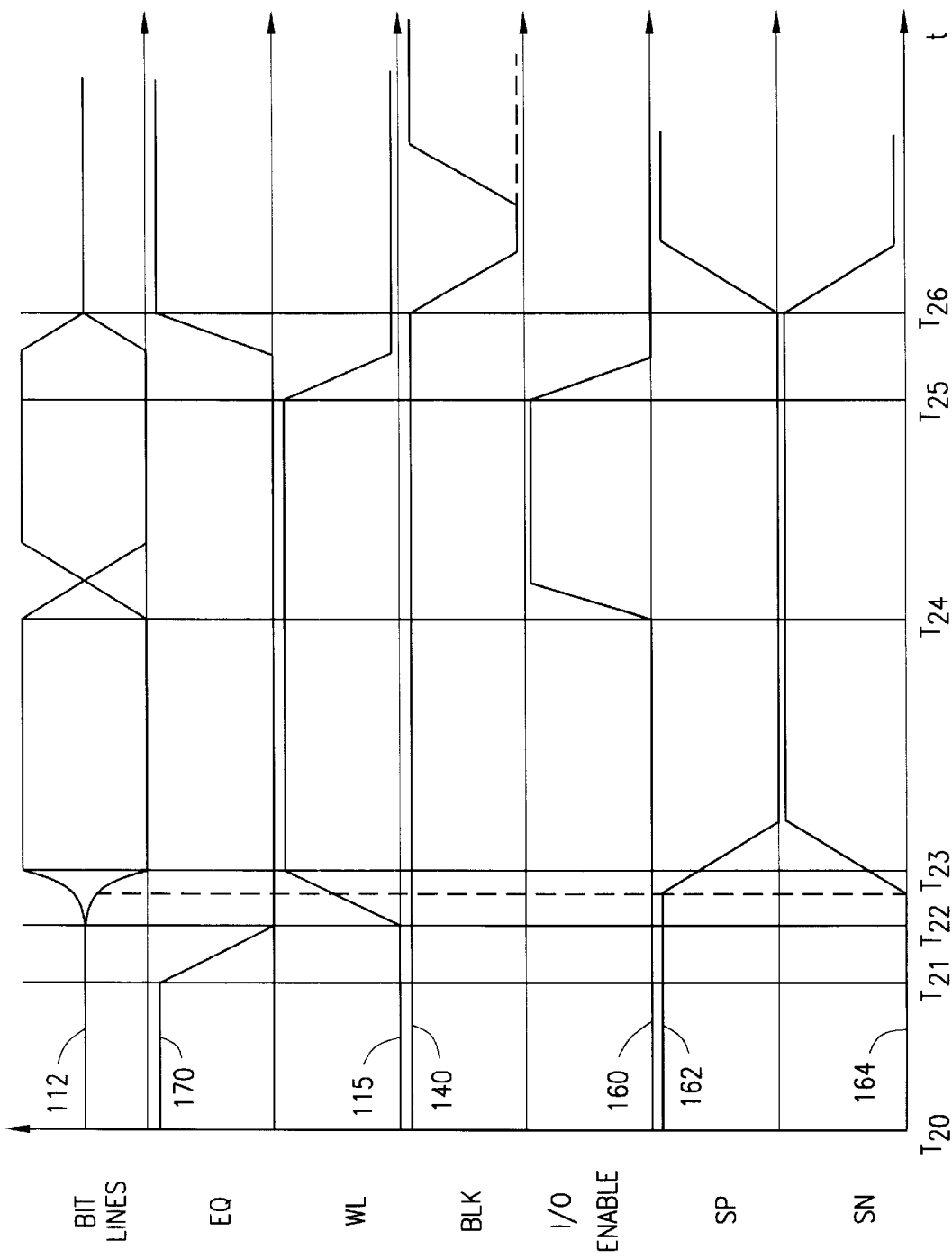
FIG. 2 is a timing diagram illustrating the execution of a traditional read-write operation.

It is certified that error appears in the above-identified patent and that said Letters Patent is hereby corrected as shown below:

Column 1,
Line 19, replace "FIG. 1" with -- FIGs. 1a and 1b (hereinafter FIG. 1) --
Line 63, replace "vdd" with -- Vdd --

Column 4,
Line 38, replace "FIG. 1" with -- FIGs. 1a and 1b (hereinafter FIG. 1) --

Signed and Sealed this

Twenty-ninth Day of January, 2002

Attest:

Attesting Officer

JAMES E. ROGAN
Director of the United States Patent and Trademark Office